United States Patent [19]

Null et al.

[11] 4,320,255

[45] Mar. 16, 1982

[54] RADIO WITH AUDIO CONTROLS AND ASSOCIATED DISPLAYS

[75] Inventors: Michael W. Null, Schaumburg; Charles W. Bethards, Algonquin; William A. Burzynski, Des Plaines, all of Ill.

[73] Assignee: Motorola, Inc., Schaumburg, Ill.

[21] Appl. No.: 158,531

[22] Filed: Jun. 11, 1980

[51] Int. Cl.³ .......................... H04R 5/04; H04S 7/00; H04B 1/26

[52] U.S. Cl. .................................. 179/1 G; 455/158

[58] Field of Search .............. 455/158, 160, 170, 177, 455/179, 169; 179/1 G, 1 GA, 1 GP, 1 GQ, 1 GJ, 1 GM

[56] References Cited

U.S. PATENT DOCUMENTS 3,962,644  6/1976  Baker .................................. 455/158
4,122,395 10/1978  Schotz et al. ....................... 455/158

*Primary Examiner*—Thomas A. Robinson
*Attorney, Agent, or Firm*—James W. Gillman; James S. Pristelski; Phillip H. Melamed

[57] ABSTRACT

An electronic pushbutton tunable radio (10) having various audio controls is disclosed. A single pushbutton (22) is utilized to implement volume, fader and balance modes of operation during which up/down pushbuttons (20,21) control the overall and relative magnitude of audio signals produced by four speakers (24–27) while at the same time a single display (17) is utilized to display, respectively, either the channel to which the radio is tuned, the relative magnitude between right and left speaker audio signals, or the relative magnitude between front and back speaker audio signals. The radio has tuning pushbuttons (14) for direct recall of preset radio channels in a tuning mode operation. The radio includes an audio mode pushbutton (23) which terminates the tuning mode and implements an audio control mode wherein the recall tuning pushbuttons (14) now serve as on/off manual controls for audio control circuits, such as the radio local/distant (L/D) circuit, while at the same time utilizing the display (17) previously utilized to indicate channel frequency to now indicate the operative state of the audio circuits controlled by the recall pushbuttons in the audio mode.

28 Claims, 9 Drawing Figures

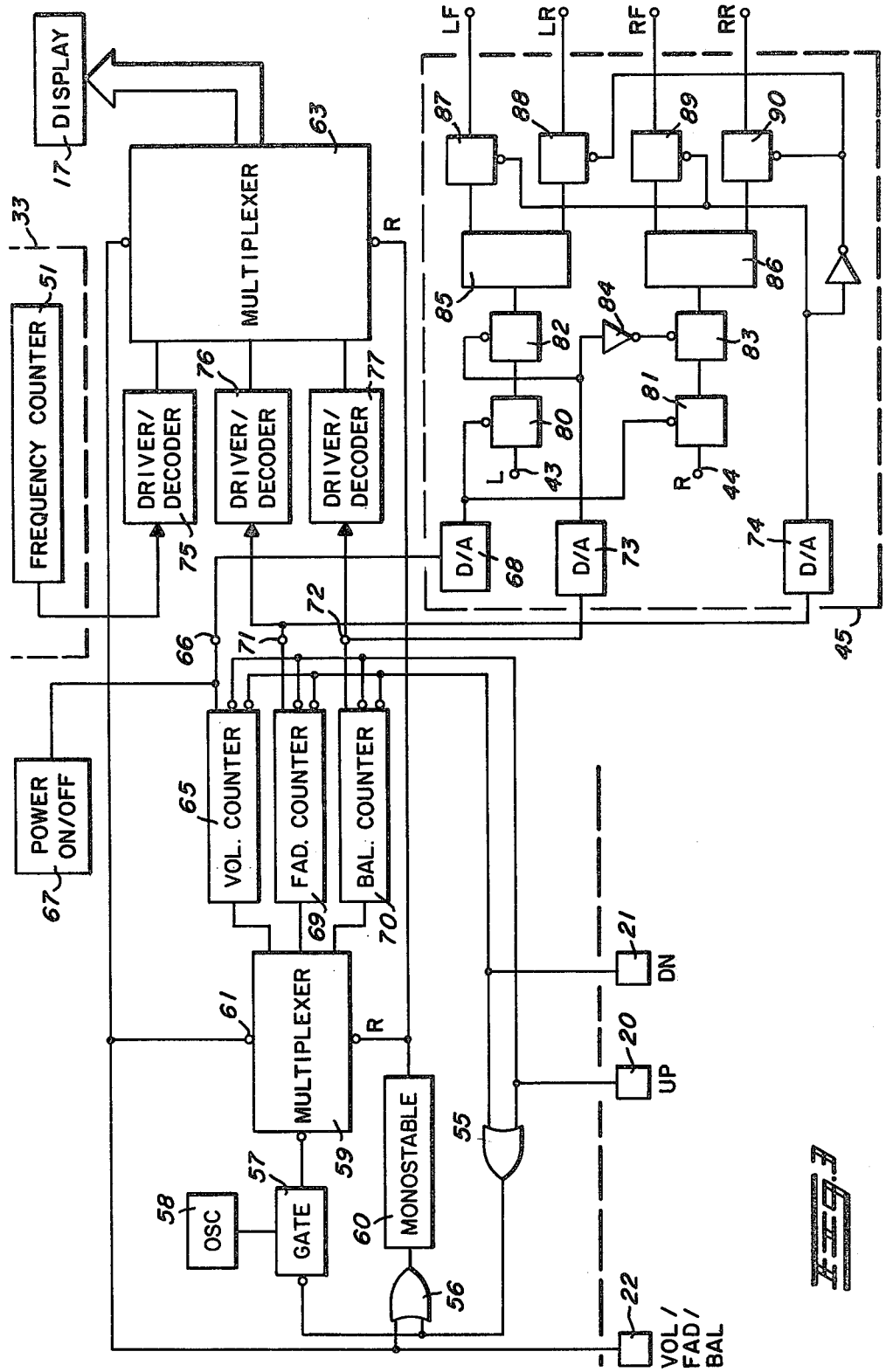

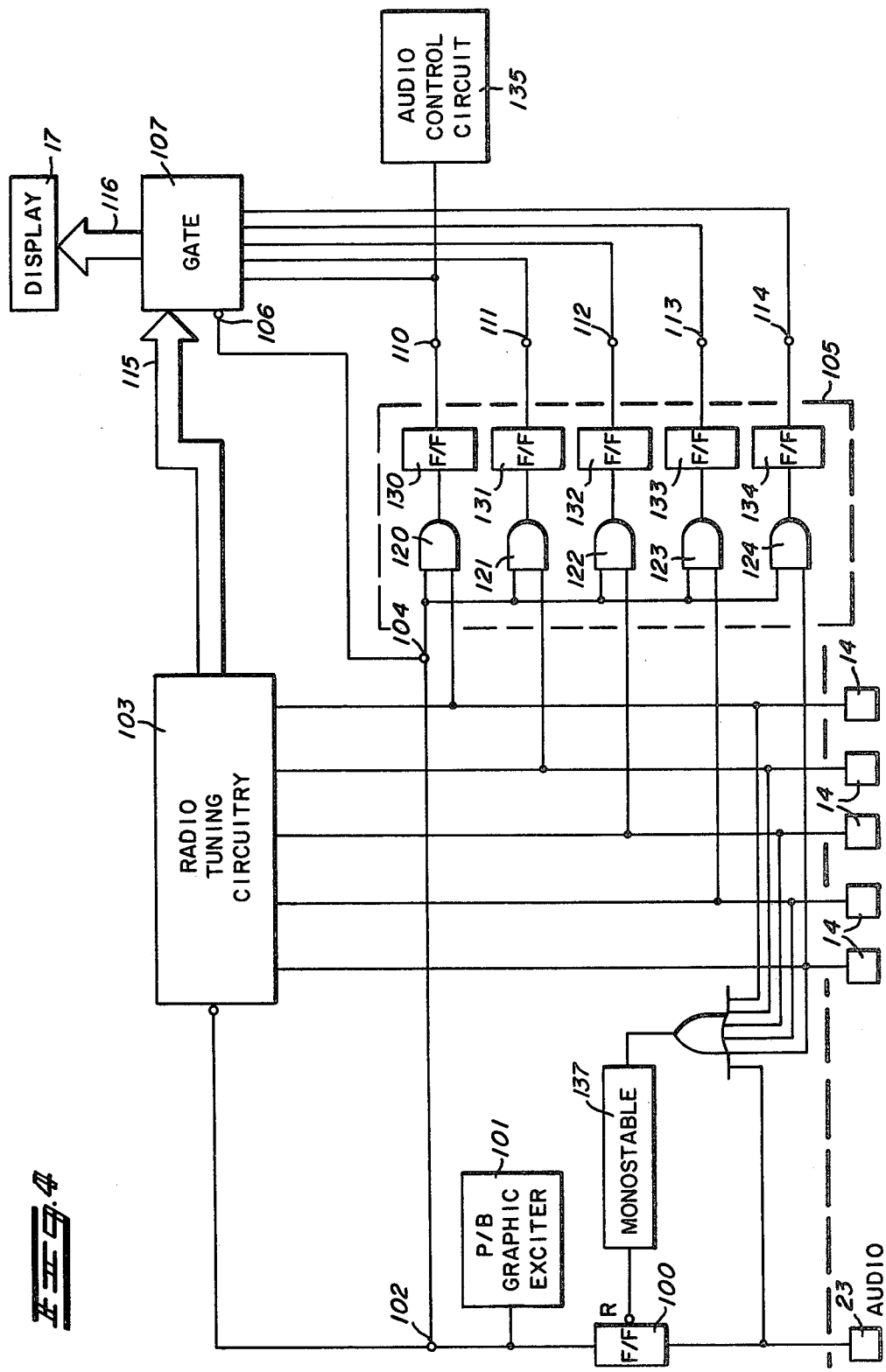

RADIO WITH AUDIO CONTROLS AND ASSOCIATED DISPLAYS

CROSS-REFERENCE TO RELATED APPLICATION

The present invention is related to the invention described in copending U.S. patent application Ser. No. 114,018, filed Jan. 21, 1980, entitled "Radio with Audio Graphic Equalizer", which is assigned to the same assignee as the present invention.

BACKGROUND OF THE INVENTION

The present invention relates generally to the field of entertainment device controls, and also their associated visual displays. More particularly, the present invention relates to audio controls for a radio, and displays associated with these audio controls, wherein preferably the radio is electronically pushbutton tunable and is intended for use in an automobile.

Typically, automobile radios have been limited in the number of audio control features and the number of visual displays since only a limited amount of manual control and display space is available in the automobile dashboard for the front control panel of the radio. Thus, to accommodate a large number of audio controls and/or a large number of different displays, the displays and controls would have to be made objectionably small thereby hindering efficient control of the radio by the operator and compromising the effectiveness of the visual displays. In addition, providing a large number of different control buttons for an automobile radio is not desirable since such radios, by necessity, must be controllable with a minimum amount of attention from the operator who may be driving the automobile at the same time that he is attempting to adjust the radio controls. Because of the aforesaid problems, typically automobile radios have not provided a device having a large number of audio control functions and their associated displays without extensively comprising the desired size and complexity of the radio controls and displays.

Generally, in order to minimize the number of controls on the front control panel of the automobile radio, such radios have utilized concentric shaft potentiometers to control balance and fader modes of operation for the radio. Some prior radios have utilized up/down pushbuttons to control the volume of the radio, and this actually represents a step backwards since now two pushbuttons are utilized to replace a single control shaft for a volume potentiometer. These prior art devices have been unable to implement a large number of audio controls and their associated visual displays within the space restraints imposed upon automobile in-dash radios without extensively comprising desired size and complexity characteristics for the controls.

In copending U.S. application Ser. No. 114,018, filed Jan. 21, 1980, and entitled "Radio with Audio Graphic Equalizer", which is assigned to the same assignee as the present invention, a radio is disclosed in which each of the channel recall tuning pushbuttons can operate as a band selector for an audio graphic equalizer wherein the actual adjustment of the audio emphasis provided to the selected band is controlled by actuation of up/down tuning pushbuttons when an equalizer mode of operation is selected for the radio. This radio also contemplates using the tuning display to display the equalizer frequency response in the equalizer mode. While this radio does eliminate a number of audio controls and their associated displays, the present invention represents a vast improvement to this radio in that a substantial number of additional audio controls are implemented without any substantial increase in the number of manually actuable radio controls and without the necessity of requiring a large number of separate and additional audio control displays.

SUMMARY OF THE INVENTION

An object of the present invention is to provide an improved entertainment device which overcomes the aforementioned deficiencies of prior entertainment devices.

A more particular object of the present invention is to provide an improved entertainment device for implementing a number of audio control functions and providing displays for these functions without substantially increasing the number of manual controls required for implementing these features and without substantially increasing the display space required for providing visuals displays for all of these audio functions, wherein preferably, the improved entertainment device comprises an electronically pushbutton tunable radio.

According to one feature of the present invention, an improved entertainment device is provided which comprises: at least first and second speakers for providing audio signals related to signals on an entertainment channel to which the entertainment device is tuned; volume control means including up/down manual switch means, the volume control means, in a volume mode of operation of the entertainment device, operative in response to actuation of the up/down switch means for simultaneously step adjusting in the same direction the overall magnitude of all of the audio signals provided by each of the first and second speakers; balance control means being operative in a balance mode of operation of the entertainment device for simultaneously step adjusting in opposite directions, in response to actuation of the up/down switch means, the overall magnitude of all of the audio signals provided by the first speaker with respect to the overall magnitude of the audio signals provided by the second speaker; and manual selection means for selecting any one of said volume and balance modes for the entertainment device, whereby the same up/down switch means controls the related functions of volume and balance.

According to the present invention, the audio volume of the radio is controlled by, preferably, separate up/down pushbuttons which increment the count of a volume control counter when the radio is in a volume mode. Preferably during the volume mode a display is provided of the channel to which the radio is tuned. By actuation of a pushbutton, a fader or balance mode is selected wherein the same up/down volume control buttons are now utilized to adjust fader and balance counters, depending upon which mode has been selected, so as to implement control of fader and balance adjustment without requiring any additional manual controls. At the same time, according to another feature of the present invention, the channel indicating display is now utilized in the fader and balance modes to provide a visual indication of the audio adjustment between the left and right or front and rear speakers. Preferably, the display provides a vertical bar which is horizontally movable to provide an indication of the difference between audio signals provided by right and left speakers in the balance mode, wherein the display provides at least one horizontal bar which is vertically movable to provide an indication of the relative difference between the front and rear speaker audio signal magnitudes during the fader mode. The terms "fader" and "balance" are well known to those in the audio signal control art and are used throughout the present explanation in accordance with their commonly understood meanings.

An additional feature of the present invention concerns providing an audio control mode pushbutton for implementing an audio control mode wherein electronic tuning pushbuttons which, in a tuning mode, directly recall preset tuning channels for the radio are now utilized to control the on/off states of various associated audio control circuits while the tuning channel display is now utilized in this audio mode to provide a visual indication of the on/off condition of the audio circuits now controlled by these tuning pushbuttons.

Each of the above-described features simplifies the number of manually actuable audio controls which are required on the front control panel of the radio in order to implement a large number of different audio control functions. At the same time, each of these features allows providing a maximum size visual display since the same display will be utilized to indicate a large number of different audio control functions as well as indicating the channel to which the radio is tuned. In this manner, the present invention has provided an improved automobile radio entertainment device.

BRIEF DESCRIPTION OF THE DRAWINGS

For a more complete understanding of the present invention, reference should be made to the drawings, in which:

FIG. 3 is a schematic diagram illustrating in block form a typical implementation for various portions of several of the components shown in FIG. 2;

FIG. 4 is a schematic diagram illustrating a typical implementation for several additional portions of various components shown in FIG. 2;

DESCRIPTION OF THE PREFERRED EMBODIMENT

Figure 1:
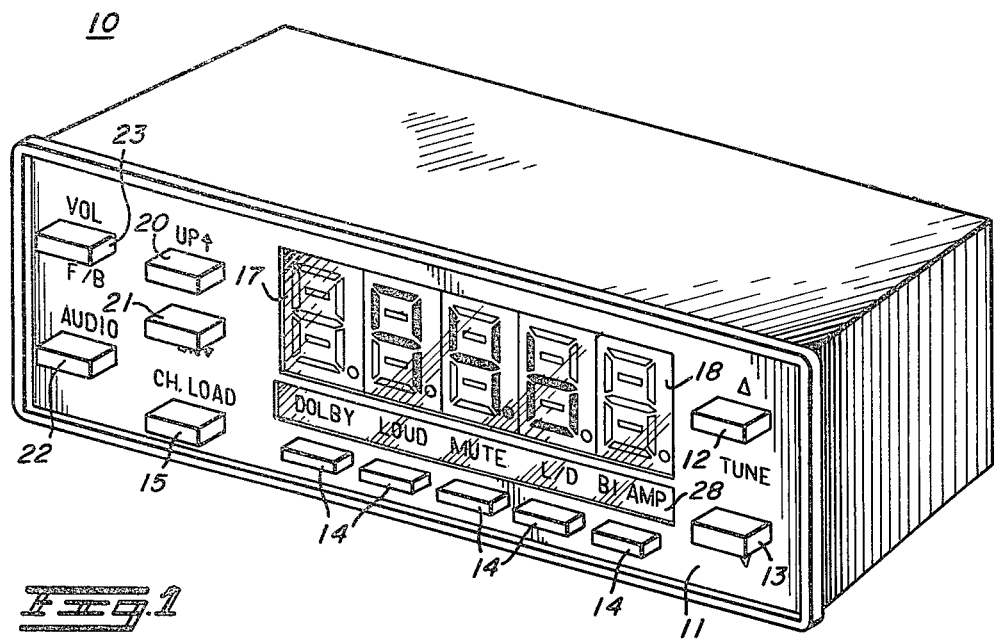
FIG. 1 is a perspective view of an automobile radio receiver constructed according to the teachings of the present invention.

FIG. 1 illustrates an automobile entertainment device comprising a radio receiver 10 which is intended for installation in the dashboard of an automobile. The receiver 10 has a front control panel 11 on which are mounted all of the manual controls for the receiver which are operator actuable. On the panel 11 are mounted all visual displays which are to be provided to the radio operator. The manual controls on the radio receiver 10 comprise a pair of up and down tuning pushbuttons 12 and 13 on the right side of the control panel 11 which incrementally step tune the radio receiver in response to actuation thereof. In addition, five electronic channel recall tuning pushbuttons 14 are provided on the control panel 11 wherein actuation of any of these pushbuttons, in a tuning mode for the radio receiver 10, will recall a preset radio channel and tune the radio receiver thereto. A channel load pushbutton 15 is also located on the front control panel 11 and is utilized to preset any of the channel recall pushbuttons 14 to specific desired radio channel frequencies in a manner which is well known to those of skill in the art and will be discussed subsequently in a general manner. A main display 17 is located on the control panel 11 and comprises five individual visual display units 18, each comprising a plurality of nine orthogonal display segments (five horizontal and four vertical) and a decimal point. In the tuning mode, when a volume mode has also been selected for the receiver 10, the main display 17 provides a visual display in arabic numeral form indicative of the entertainment channel to which the receiver 10 is tuned.

The operation of the components of the radio receiver 10 which have been recited so far, are explained in detail in copending U.S. application Ser. No. 114,018, filed Jan. 21, 1980, and entitled "Radio with Audio Graphic Equalizer" and assigned to the same assignee as the present invention. Essentially, these elements electronically tune the radio receiver in a tuning mode by use of the step tuning of the pushbuttons 12 and 13 or the direct channel recall function of the tuning pushbuttons 14. This type of operation is conventional and is explained in detail in the copending application. The copending application also describes a graphic equalizer, integral with a radio receiver, and this structure could be readily added to the present receiver 10, if desired.

According to the present invention, the front control panel 11 also includes individual up and down pushbuttons 20 and 21 which together form an up/down manual switch means that, during a volume mode of operation for the radio, perform the function of a volume control means in that they are operative in response to actuation during the volume mode for simultaneously step adjusting the overall magnitude of all of the audio signals provided by four speakers (24–27 shown in FIG. 2) which are connected to the radio receiver 10. The control panel 11 also includes a mode select pushbutton 22 which upon actuation sequentially selects volume, fader and balance modes of operation for the radio receiver 10. As was previously stated, in the volume mode, the up/down pushbuttons 20 and 21 step increment the overall volume of the audio signals provided by the speakers connected to the receiver 10. In the fader and balance modes of operation, actuation of the up/down pushbuttons 20 and 21 now adjust the relative magnitude of the audio signals produced by front/rear or left/right sets of speakers. Also, the main display 17 in the fader/balance modes is used to provide visual indications of the front/rear or left/right audio emphasis, rather than the tuned channel indication. The terms "fader" and "balance" are used herein in their normal connotation of the front-to-rear audio emphasis between speakers and the left-to-right audio emphasis between speakers, respectively.

The control panel 11 also includes an audio mode select pushbutton 23 which upon actuation changes the radio receiver from its tuning mode, during which the pushbuttons 14 recall preset channel frequencies and tune the receiver thereto, to an audio mode wherein actuation of any of the pushbuttons 14 now act as on/off pushbuttons for controlling various audio control circuits associated which each pushbutton. During the audio mode, the display 17 is now used to provide a visual indication of the on/off operative state of these audio circuits rather than indicate the channel to which the receiver 10 is tuned. Above each of the pushbuttons 14 are graphic labels preferably positioned on a selectively illuminated light panel 28 such that during the audio mode these graphics, which identify the audio control circuits associated with the pushbuttons 14 in the audio mode, are illuminated.

The details concerning the operation of the audio controls shown in FIG. 1 and the implementation of the various different displays through the utilization of the main display 17 will now be more fully explained with regard to the remaining FIGS. 2-6.

Figure 2:
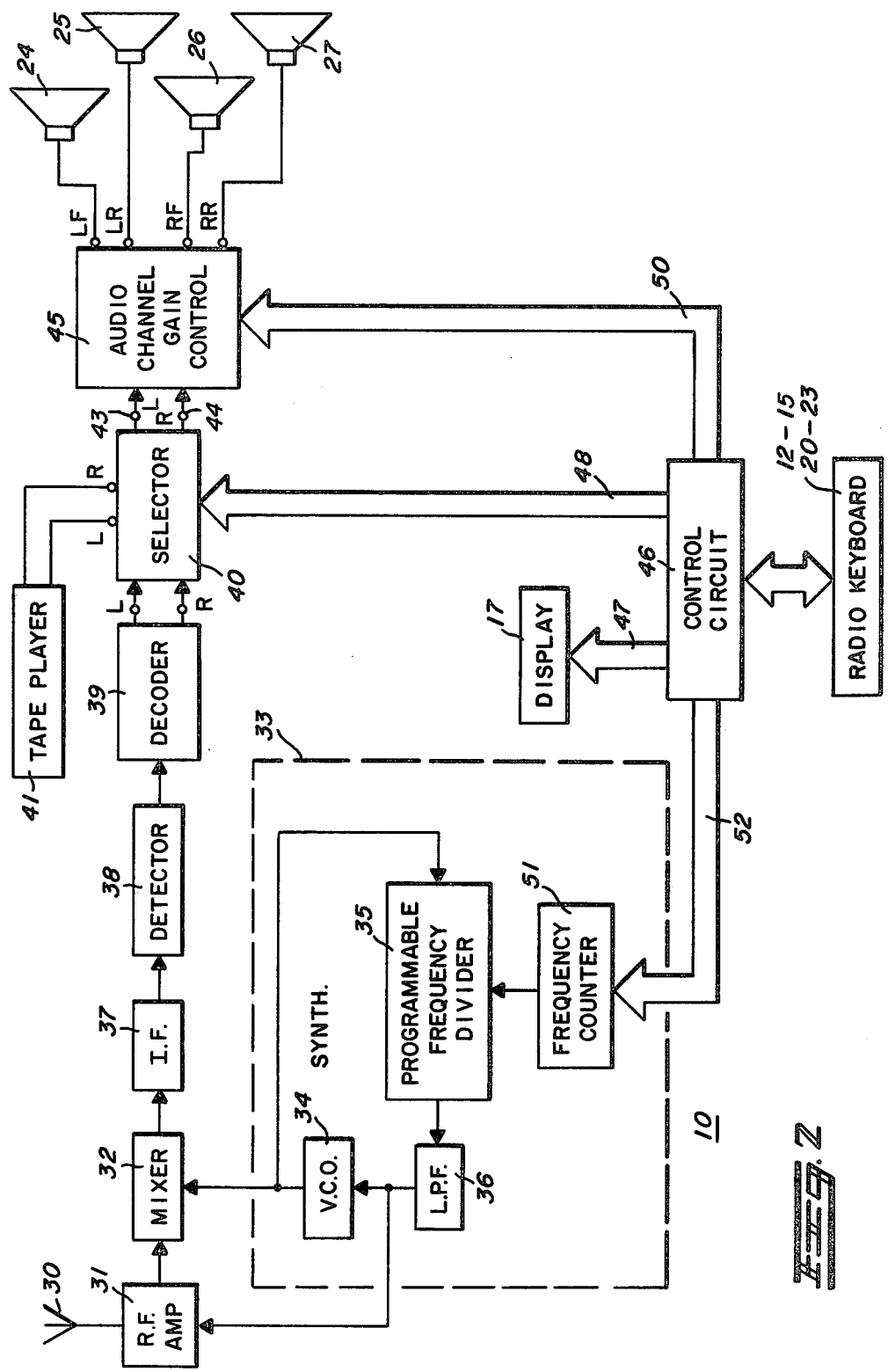
FIG. 2 is a schematic diagram illustrating in block form the electrical components of the radio receiver in FIG. 1.

FIG. 2 illustrates a block schematic of the radio receiver 10 wherein the audio output of this receiver is provided at four speaker output terminals designated left front (LF), left rear (LR), right front (RF) and right rear (RR), which are connected to four speakers 24-27, respectively, that are positioned in appropriate locations in an automobile carrying the receiver 10 wherein these notations correspond to the conventional audio output designations.

The radio receiver 10 receives an RF input signal at an antenna 30 that supplies an input to an RF amplifier 31 which supplies amplified RF signals as an input to a mixer stage 32 that also receives an input tuning signal from a frequency synthesizer 33 that comprises a phase locked loop comprising a voltage controlled oscillator 34, a programmable frequency divider 35, and a low-pass filter 36 connected in a phase locked loop configuration with the output of the low-pass filter 36 also being coupled to the RF amplifier 31 as a tuning control signal for that amplifier. The output of the mixer range 32 is connected to an IF stage 37 which provides an amplified output to a detector stage 38 that detects the modulation on the received RF signal effectively selected by the mixer 32 and supplies this detected modulation to a decoder 39 which for stereo reception supplies decoded left and right channel audio signals at output terminals and for monaural reception supplies the same signal at the left and right output terminals.

The left/right output signals of the decoder 39 are supplied as inputs to an entertainment device selector 40 which also receives left/right audio inputs from a tape player 41. In accordance with control signals received by the selector 40, one or the other of the sets of left/right audio outputs are supplied as outputs to left and right channel terminals 43 and 44. The terminals 43 and 44 are coupled as inputs to an audio channel gain control circuit 45 which essentially splits the left/right audio signals into left front, left rear, right front and right rear audio signals that are supplied to the output terminals LF, LR, RF and RR, respectively, and this is accomplished in accordance with received control signals that dictate the overall magnitude of the audio signals provided at each of these terminals as well as the relative magnitude difference between the audio signals provided at each of these terminals. The manner in which this is accomplished will be discussed subsequently.

FIG. 2 illustrates that the manual controls which comprise the radio keyboard and include the pushbuttons 12-15 and 20-23 are coupled to a control circuit 46 which supplies display information to the display 17 via a connection 47, entertainment device selector control signals to the selector circuit 40 via a connection 48, volume, fader and balance control signals to the audio channel gain control circuit 45 via a connection 50, and radio channel selection control signals to a frequency counter 51 in the synthesizer 33 via a connection 52 wherein the frequency counter 51 provides a control count to the programmable frequency divider 35 to control the operation of the synthesizer 33 that tunes the radio receiver 10.

Essentially, in response to actuation of the pushbuttons on the radio keyboard, the control circuit 46 implements various audio controls and provides various displays. Preferably, all of this is accomplished by means of a programmed microprocessor which functions in accordance with the flow chart depicted in FIG. 6. To illustrate the operation of the microprocessor, in addition to the FIG. 6 flow chart, discrete component implementation schematics are illustrated in FIGS. 3 and 4 which demonstrate feasible constructions for implementing the various audio control features and their associated displays which are part of the present invention. In all of the figures, corresponding identical components have been given identical reference numbers.

Essentially, the operation of the front end radio components 30-39 shown in FIG. 2 function conventionally to tune the radio, which can be AM or FM, to a desired channel and provide either a monaural or stereo output at the decoder 39 two output terminals designating the left and right channels. The operation of all of these components is conventional and therefore does not require detailed explanation. The selector circuit 40 merely selects, in accordance with control signals on the connection 48, whether the left/right audio signals from the radio or from a tape player 41 will be provided to the speakers 24-27. Thus, the selector circuit 40 merely comprises elementary AND gate selector logic which is within the capability of those of average skill in the art.

If desired, an equalizer circuit corresponding to the circuit shown in the copending application previously referred to can be inserted between the terminals 43 and 44 and the audio circuit 45. The copending application also discloses in detail how a control circuit, such as circuit 46, provides control signals to a frequency counter that in turn controls a programmable divider in a frequency synthesizer that tunes a radio receiver, and this explanation is hereby incorporated by reference.

The present invention essentially deals with the use of the control circuit 46 to control the display 17 and audio channel gain control circuit 45 in accordance with the actuation of the manual pushbutton controls contained on the radio keyboard. Because of the manner in which the present invention accomplishes its control of the radio receiver, the size of the required display space and the number of manually actuable controls for the radio is reduced while providing for an extremely large number of audio control functions and associated displays that would previously have been impossible to implement within the space limitations required for an automobile radio receiver. Before discussing the features of the present invention, it should be noted that the tape player 41 and selector circuit 40 have been included in FIG. 2 merely to illustrate that the audio control configuration for the present invention is applicable to any audio entertainment device rather than being limited to a radio receiver. Obviously, a radio/tape player select pushbutton could have been mounted on the control panel 11 of the radio receiver and generate a control voltage, via a flip-flop, that would result in selecting either the radio receiver or the tape player 41 for connection to the audio channel gain control circuit 45 of the present invention.

The operation of the audio control circuits contemplated by the present invention will now be discussed in detail with regard to FIGS. 3-6. Initially, the discrete component implementations illustrated in FIGS. 3 and 4 will be discussed with regard to how they implement various audio control features and provide the displays indicated in FIGS. 5A-D for the main display 17. Subsequently, the flow chart in FIG. 6 will be discussed with respect to how it corresponds to the operation of the discrete component implementations and how it describes the preferred operation of a microprocessor implementation of the discrete circuits.

FIG. 3 essentially illustrates a discrete implementation for utilizing the volume/fader/balance selection pushbutton 22 and the up and down pushbuttons 20 and 21 to implement various audio control functions and also provide associated displays through the utilization of the main display 17. Each of the pushbuttons 20-22, as well as all of the other pushbuttons on the control panel 11, is contemplated as providing a high logic signal during manual actuation thereof and reverting to a low logic signal upon the release of manual actuation of the pushbutton. The up and down pushbuttons 20 and 21 are connected as inputs to an OR gate 55 which has its output coupled as an input to an OR gate 56 and to a control terminal of a series gate 57 that receives the output of an oscillator 58 and selectively passes and blocks the output of this oscillator with respect to an input terminal of a multiplexer 59. The pushbutton 22 is directly coupled as an input to the OR gate 56 which supplies an output signal to a monostable 60 which preferably has a duration of ten seconds and is retriggered upon each positive logic signal produced by the OR gate 56. The output from the pushbutton 22 is also coupled to a step control input terminal 61 of the multiplexer 59 and a step control input terminal 62 of a multiplexer 63. Reset terminals R of the multiplexers 59 and 63 both receive inputs from the output of the monostable 60.

A volume counter 65 has its count input coupled to the multiplexer 59 and provides a digital count output at a terminal 66 which is coupled to a power on/off circuit 67 and to a digital-to-analog converter circuit 68 (D/A) contained in the audio channel gate control circuit 45. A fader counter 69 and a balance counter 70 also receive inputs from the multiplex circuit 59 and provide control outputs at respective terminals 71 and 72 that are connected to respective D/A converter circuits 73 and 74. Each of the counters 65, 69 and 70 receive count increment/decrement control signals by virtue of control connections to the up/down pushbuttons 20 and 21. A driver/decoder circuit 75 receives an input count from the frequency counter 51 in the synthesizer 33 and supplies a corresponding decoded display drive signal as an output which is received as an input by the multiplexer circuit 63. Driver/decoders 76 and 77 receive their count inputs by virtue of respective connections to the terminals 71 and 72 and also provide their display drive outputs as inputs to the multiplexer circuit 63. The output of the multiplexer 63 is coupled to the main display 17.

Essentially, normally the radio receiver 10 will be in a volume mode of operation. During this mode, the multiplexers 59 and 63 are set so that the output of the gate 57 will be coupled via multiplex circuit 59 only to the volume counter 65 and only the output of the driver/decoder 75 will be directly coupled via the multiplex circuit 63 to the display 17. In this manner, upon manual actuation of either the up or down pushbuttons 20 or 21, the OR gate 55 will produce an output during this actuation that will result in the gate 57 passing oscillator pulses through the multiplex circuit 59 to the volume counter 65. This results in incrementing or decrementing the output count of the counter 65 at the terminal 66. Thus, during the volume mode, a count is obtained at the terminal 66 which is indicative of the amount of overall magnitude of audio signals (volume) that is desired by the operator of the radio receiver 10. During this volume mode, the frequency counter 51 will contain a count, controlled either by the channel recall pushbuttons 14 or the up/down tuning incrementing pushbuttons 12 and 13 which is indicative of the channel to which the radio receiver 10 is tuned. This manner of operation for the frequency counter 51 is conventional for electronically tuned radios. The count in the frequency counter 51, besides being coupled to the programmable frequency divider 35 in the synthesizer 33 (as indicated in FIG. 2) also serves as an input to the driver/decoder 75 which essentially converts this count into drive signals which are suitable for driving the display 17 so as to produce an arabic numeral indication of the frequency or entertainment channel to which the radio receiver 10 is tuned. Such driver/decoders are used in almost every electronic tuning display and are therefore well known to those of skill in the art.

In order to select either a fader mode or a balance mode of operation for the radio receiver, the pushbutton 22 will be actuated. This results in providing a high logic signal transition at the terminals 61 and 62 of the multiplexers 59 and 63. These multiplexers are conventional in that in response to logic signal inputs at their step terminals, they sequentially step connect either a plurality of outputs to a single input or a plurality of inputs to a single output. In essence, they merely comprise step switches, and such multiplexing circuits are readily available and well known. Assuming that the volume mode previously existed, in response to the next actuation of the pushbutton 22, this will result in coupling the output of the gate 57 to the fader counter 69 and in coupling the driver/decoder 76 to the main display 17. In this manner, during the fader mode, actuation of the up or down pushbuttons 20 and 21 will now result in incrementing the fader counter 69 wherein the fader count of terminal 71 will now supply decoded drive signals to display 17 which will now produce a fader display related to these drive signals rather than the tuned channel drive signals provided by the driver/decoder 75. When a balance mode of operation is desired, in response to the next actuation of the pushbutton 22, the multiplexer circuits 59 and 63 will again step connect their inputs and outputs such that the gate 57 will now be connected to the balance counter 70 and the output of this counter, via the driver/decoder 77 and the multiplexer 63, will now provide the driving excitation for the main display 17.

Figure 5A:
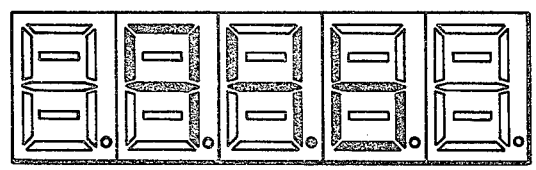
FIGS. 5A–5D are a series of graphic representations of various displays provided by the radio receiver shown in FIG. 1.
Figure 5B:
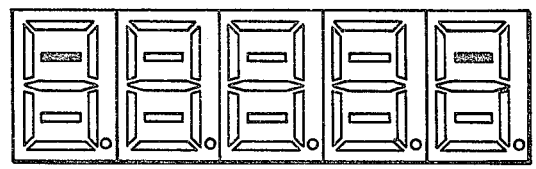
Figure 5C:
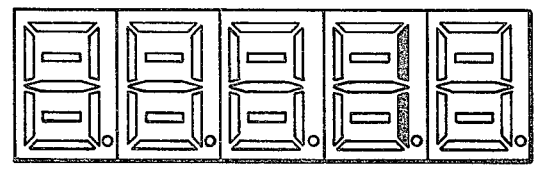

The operation of the present invention regarding the providing of different displays for the volume, fader and balance modes can best be understood by referring to FIGS. 5A-5C which illustrate, respectively, the type of visual indications provided by the main display 17 during these modes. FIG. 5A illustrates that during the volume mode, the display 17 provides an arabic numeral indication (94.6) indicative of the frequency to which the radio receiver 10 is tuned.

FIG. 5B illustrates that during the fader mode, different drive signals are supplied to the main display 17 such that a horizontal bar is provided in response to the count of the fader counter 69 wherein the vertical position of this horizontal bar is variable and indicates the amount of desired front-to-rear audio emphasis. The horizontal bar for fader indication is formed by the two end display units 18. Having the bar at the top indicates a maximum front audio emphasis while providing this bar at the bottom would indicate a maximum rear audio emphasis. Assuming that the fader counter merely counts between states of 1 and 5, providing a driver/decoder 76 to implement this type of visual display in response to a count of 1–5 would merely require elementary logic devices and therefore be well within the capabilities of those of average skill in the art.

In a similar manner, during the balance mode of operation the balance counter 70 provides a count to the terminal 72 which results in the driver/decoder 77 providing excitation signals for the main display 17 to cause a horizontally adjustable vertical bar to be positioned to the right or left in the display 17 so as to indicate the desired amount of left or right emphasis. Again, elementary logic circuits in the driver/decoder 77 can be utilized to translate the count at the terminal 72 into appropriate drive signals for the main display 17 to create this result.

The present invention, as explained in the previous paragraphs, has provided various counts at the terminals 66, 71 and 72 which are indicative of desired modes of audio control circuit operation, and during the implementation of volume, fader or balance modes, these counts result in having the display 17 provide various desired visual indications comprising, respectively, the channel to which the radio is tuned (in arabic numerals), a horizontal bar vertically movable to indicate the desired front-to-rear audio emphasis, and a vertical bar that is horizontally movable to indicate the desired left-to-right audio emphasis. It should be noted that for the displays provided in the fader and balance modes, the visual displays are other than arabic numeral to avoid confusing these displays with the tuned channel arabic numeral indication provided in the volume mode.

A feature of the present invention is that any volume counter counts above 0 result in providing DC power to the power audio amplifiers of the radio receiver. This is accomplished by the power on/off circuit 67 effectively closing a DC power supply gate that supplies power to these circuits for all volume counter counts equal to and above 1 and terminating the power being supplied to the audio power amplifiers for a 0 volume counter count. In this manner, the up/down pushbuttons 20 and 21 together effectively replace having a separate on/off switch for the radio receiver 10, while the present invention also clearly contemplates using these same up/down pushbuttons for incrementing fader and balance counters as well as controlling the count in the volume counter 65. Conventional logic gates implement the function of the power on/off circuit 67.

Another feature of the present invention resides in utilizing the monostable 60 to provide for resetting the multiplexers 59 and 63 so as to implement the volume mode after either (1) 10 seconds has elapsed from the creation of any mode other than the volume mode or (2) 10 seconds has elapsed from the last actuation of either the up and down pushbuttons 20 or 21 while the radio receiver is in a mode other than the volume mode. The automatic resumption of the volume mode is caused by having the output of the monostable 60 terminate 10 seconds after an input trigger signal is provided by the OR gate 56. This will result in providing a reset pulse transition at the terminals R of the multiplexers 59 and 63 wherein this results in resetting these multiplexers to their first operative state wherein the gate 57 is directly coupled to the volume counter 65 and the driver/decoder 75 is directly coupled to drive the main display 17. In this manner, the operator of the radio receiver 10 does not need to return to the volume mode of operation, since this will be accomplished automatically by the OR gate 56 and monostable 60. Providing multiplexers 59 and 63 with such a reset function is well within the capabilities of those of skill in the art. It should be noted that for each actuation of the pushbuttons 20–22 the pulse duration of the monostable 60 will be extended for an additional 10 seconds thus providing for resetting at the total end of the monostable pulse. It should also be noted that the creation of the monostable pulses while the radio receiver is in the volume mode, will have no effect since any reset pulses generated therein will not result in altering the volume audio mode.

While the preceding explanation of the present invention has illustrated how the counts of the counters 65, 69 and 70 result in altering the main display 17 such that instead of the tuned channel indication, a fader or balance indication is provided, the actual implementation of adjusting the audio signals in accordance with the output counts at the terminals 66, 71 and 72 has not yet been described. This feature of the present invention is implemented by the audio channel gain control circuit 45 and will now be discussed.

FIG. 3 illustrates that the audio circuit 45 includes the D/A circuits 68, 73 and 74. The left and right audio channel terminals 43 and 44 are provided as inputs to amplifiers 80 and 81 which receive identical analog gain control input signals from the output of the digital to analog converter 68 which receives its digital input from the terminal 66. In this manner, the output count of the volume counter 65 is utilized for simultaneously step adjusting the overall magnitude of both the left and right audio channel signals in the same direction. This can be readily implemented by gain control amplifiers which are responsive to an analog gain control signal.

The outputs of the amplifiers 80 and 81 are coupled, respectively, as inputs to amplifiers 82 and 83 which receive complementary gain control signals by virtue of a direct connection of the amplifier 82 to the output of the converter 73 and the connection the converter 73 through an inverter stage 84 to the amplifier 83. In this manner, the digital count at the terminal 72 enables the up/down pushbuttons 20 and 21 to simultaneously step adjust in opposite directions the overall magnitude of the left audio channel signals with respect to the overall magnitude of the right audio channel signals. The outputs of the amplifiers 82 and 83 are provided as inputs to the power splitter circuits 85 and 86 which essentially provide two identical output channels in response to one received input channel. In this manner, four output signals, two being associated with the left audio channel and two being associated with the right audio channel, are provided. The left audio channel outputs from the splitter 85 are coupled to separate amplifiers 87 and 88 which receive complementary gain control input signals by virtue of direct and inverting connections to the output of the converter 74. In a similar manner, the right audio channel outputs of the splitter 86 are coupled to separate amplifiers 89 and 90 which also receive complementary gain control signals by virtue of direct and inverting connections to the output of the converter 74. The outputs of the amplifiers 87-90 are directly connected to the four audio output terminals, LF, LR, RF and RR, respectively.

An analysis of the previously recited configuration reveals that this structure provides for utilizing the counter counts at the terminals 66, 71 and 72 to implement not only the desired volume control of the audio signals of the four speakers, but also to adjust these signals with respect to the desired balance and fade emphasis which has been selected by the operator of the radio receiver. All of this has been accomplished without providing any additional manual controls on the limited space of the front control panel 11, and in addition, large visual displays indicative of the fader and balance adjustments have also been provided without requiring the control panel 11 to provide separate visual displays for these indications which would occupy space in addition to the space occupied by the main display 17 which is normally utilized to indicate the tuned channel.

While the present invention illustrates the use of separate pushbuttons 20 and 21, obviously a rocker switch could be utilized as an equivalent up/down manual switch means for accomplishing the desired end result. In addition, other types of visual displays indicative of balance and fader settings could be utilized, but the displays described in the preferred embodiment of the present invention are believed to be optimal since they provide an other than arabic numeral visual display indicative of the desired adjustment of the audio controls in accordance with the desired fader and balance modes of operation for the radio receiver 10. In addition, the specific displays illustrated would not be readily confused with the type of equalizer display contemplated by the copending U.S. application previously referred to. It should be noted that during the operation of the present invention, it is contemplated that the counts of the volume counter 65, the fader counter 69 and balance counter 70 will be maintained at their previous levels whenever these counters are not being incremented due to the passage of oscillator pulses to these counters through the multiplexer circuit 59.

An additional aspect of the present invention is illustrated in FIG. 4 wherein the tuning channel recall pushbuttons 14 are utilized in an audio control mode to act as on/off switches for various associated audio control circuits while the main display 17 is utilized to provide an indication of the on or off state of these control circuits. FIG. 4 illustrates that the audio mode select pushbutton 23 is coupled to a flip-flop circuit 100 whose output provides an input signal to a pushbutton graphic exciter 101 and a control terminal 102 that is coupled to the radio receiver tuning circuitry including the synthesizer 33 and frequency counter 51. The control terminal 102 is also coupled to a control terminal 104 of a gating circuit 105 shown dashed in FIG. 4 and to a control terminal 106 of a gate circuit 107. Each of the channel recall tuning pushbuttons 14 is directly connected to the radio tuning circuitry 103 and the audio gate circuit 105. The gate circuit 105 provides five separate outputs at terminals 110-114 which are directly connected as inputs to the gate 107, which also receives an input via a connection 115 from the tuning circuitry 103, and the gate 107 provides an output drive signal for the main display 17 via a connection 116.

The audio gate circuit 105 comprises five AND gates 120-124 each of which receives an input by virtue of a direct connection to the terminal 104, and each of the AND gates is separately connected to a different one of the channel recall pushbuttons 14. The outputs of each of the AND gates 120-124 is coupled as an input to an associated flip-flop circuit 130-134, respectively, whose outputs are directly coupled to the terminals 110-114, respectively. A typical audio control circuit 135 is shown as being connected to the output terminal 110, and it is understood that other audio control circuits similar to the circuit 135 are also connected to each of the terminals 111-114.

The circuitry described in FIG. 4 operates as follows. During the normal tuning mode of operation, the channel recall pushbuttons 14, by virtue of their connection to the components in the tuning circuitry 103, provide for electronically tuning the radio receiver 10 in a known manner. This feature is conventional and is also described in detail in the copending U.S. application previously referred to. During this tuning mode, the gate 107, by virtue of the control signal at the terminal 106, will pass display drive information supplied by the circuitry 103 through the connection 115 to excite the main display 17. In other words, during the tuning mode, the main display 17 receives information related to the tuned channel indication.

In response to actuation of the pushbutton 23, the flip-flop 100 is toggled such that a high control signal is provided to the graphic exciter 101. This results in illuminating the graphics on the light panel 28 located above the pushbuttons 14 on the front control panel 11 of the radio receiver. This provides an indication of the existence of an audio mode for these pushbuttons, rather than the normal tuning mode which exists for the radio receiver. The output of the flip-flop 100 in this audio mode also alters the control signal at the terminal 102 which results, by virtue of its connection to the circuitry 103, in making the tuning circuitry insensitive to subsequent actuation of the tuning channel recall pushbuttons 14 during the audio mode. In other words, during the audio mode, actuation of the pushbuttons 14 will not cause tuning of the radio. Obviously, this can be implemented by elementary logic which would selectively block the connection of these pushbuttons to the tuning circuitry in response to control signals at terminal 102.

During the audio mode, the control signal present at the terminal 104 will be a high logic state and therefore allow, via the AND gates 120-124, actuation of any of the pushbuttons 14 to now toggle any of the flip-flop circuits 130-134. In this manner, actuation of the channel recall pushbuttons 14 will now control the output state of the flip-flop circuits 130-134. The control signals provided at the terminals 110-114 are utilized as on/off control signals which can now be controlled by actuation of the pushbuttons 14.

Figure 5D:
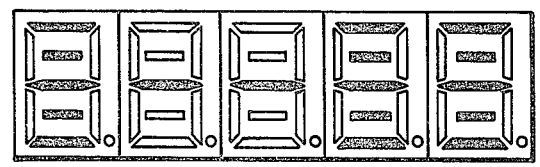

The control signal at the terminal 106 during the audio mode causes the gate 107 to inhibit passing the display information on the connection 115 to the main display 17, and now passes the control indications at the terminals 110-114 to the display 17. FIG. 5D indicates the type of displays which are contemplated during this mode wherein the excitation of all of the horizontal bars of an associated display unit 18 indicates an on function for an audio control circuit by virtue of a high logic state at one of the terminals 110-114 and wherein excitation of only the center horizontal bar of one of the display units 18 indicates an off mode of operation for a control circuit by virtue of a low logic state at one of the terminals 110–114. In this manner, the main display 17 now provides a large visual display indicative of the on/off state of audio control circuits which are controlled by the signals present at the terminals 110–114.

One audio control circuit 135 is illustrated in FIG. 4 and could represent any of the type of audio control circuits identified by the graphics above the pushbuttons 14 illustrated in FIG. 1. These types of audio control circuits correspond to a local/distant (L/D) switch for radio operation, a loudness switch which would simultaneously emphasize the high and low frequency response without increasing the midrange response, a bi-amp audio control mode which would customize the frequency response such that the front two speakers emphasize the high and midrange frequencies while the back two speakers emphasize the low frequency response, or various other types of audio control circuits, all of which are well known and all of which can be implemented in response to receiving an on or off control signal which is contemplated as being provided at the output terminals 110–114.

While FIG. 4 does not specifically illustrate the type of display driver circuits needed to produce the type of display indicated in FIG. 5D, such circuits are obviously within the design capability of those of average skill in the art and can be implemented by elementary logic blocks. It should be noted that the type of display produced in FIG. 5D during the audio mode is again a display which is other than an arabic numeral indication such that this display will not be confused with the tuned channel indication normally provided in the tuning mode of operation.

It should also be noted that the present embodiment in FIG. 4 also contemplates the use of a monostable circuit 137 which has its input coupled to the audio mode pushbutton 23 and has its output coupled to a reset terminal R of the flip-flop circuit 100 so as to reset this flip-flop to implement the normal tuning mode after a predetermined time delay which preferably would be 10 seconds after the implementation of the audio mode by actuation of the pushbutton 23, or 10 seconds from the last actuation of any of the channel recall pushbuttons during the audio mode.

Preferably when combining the circuits in FIGS. 3 and 4, the display drive output of the multiplexer 63 would correspond to the connection 115 in FIG. 4, such that the audio mode display overrides the volume/balance/fader displays.

In essence, the present invention has provided numerous audio controls for a radio receiver and has accomplished this without requiring a substantial number of manually actuable controls and without requiring extensive display space for providing separate simultaneous displays indicative of all of the various audio controls where are to be implemented. As stated previously, preferably the present invention contemplates the use of a microprocessor to implement the desired end results to be accomplished by the control circuit 46 and which are accomplished by the discrete circuit implementations shown in FIG. 3 and 4.

Figure 6:
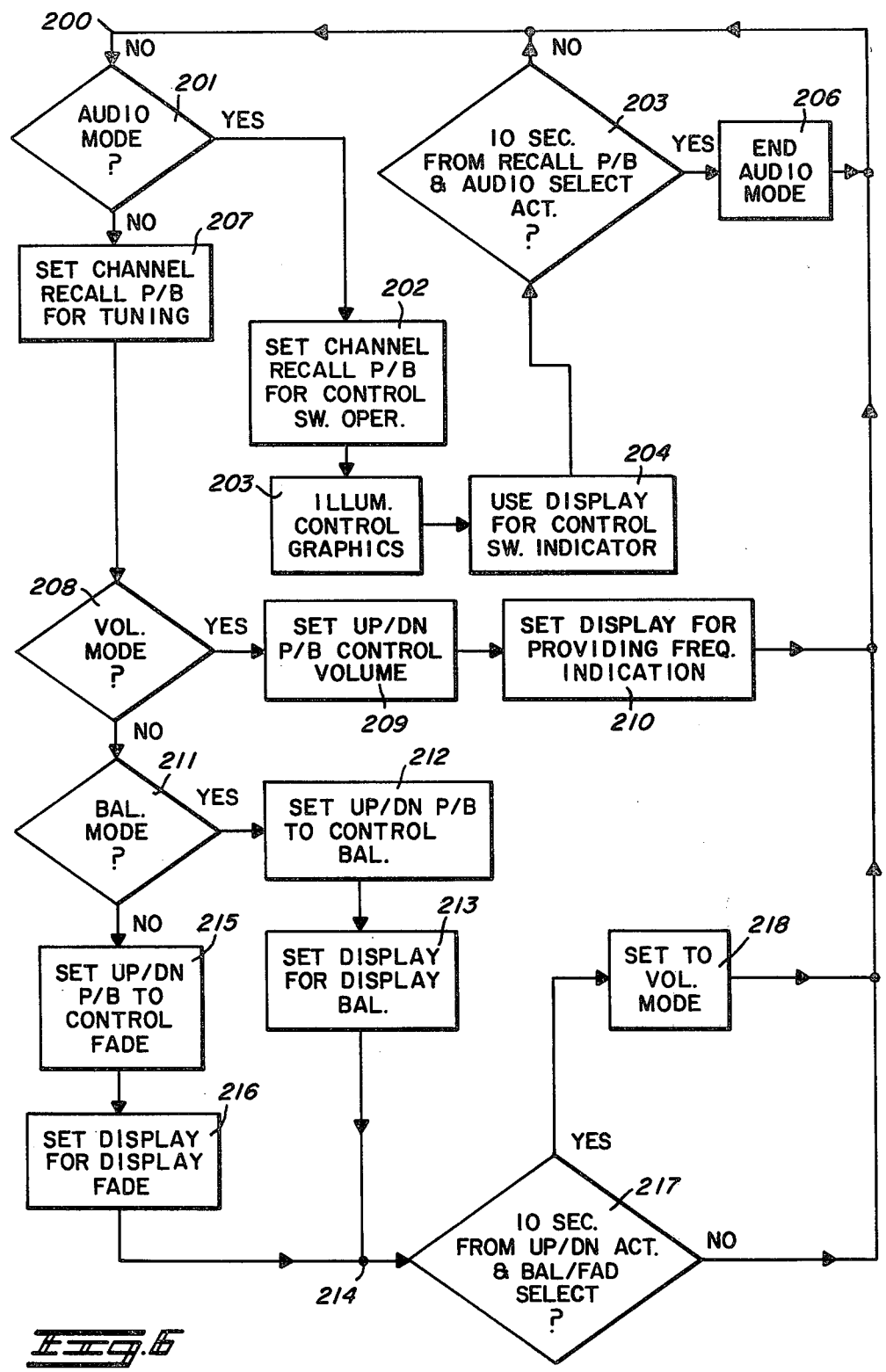
FIG. 6 is a flow chart for the operation of the components illustrated in FIGS. 1–4.

FIG. 6 illustrates a flow chart for such a microprocessor wherein diamond-shaped elements are decision blocks for the microprocessor and rectangular blocks represent process steps which are to be implemented by the microprocessor in accordance with the type of decision made by the decision block. The flow chart in FIG. 6 will now be discussed in detail with respect to how it implements the desired microprocessor operation and how it also describes the operation of the discrete circuits in FIGS. 3 and 4.

Referring to FIG. 6, the flow chart is entered at an initial terminal 200. Subsequently, an audio mode decision block 201 tests whether an audio mode has been implemented. Obviously, this test corresponds to testing the logic state at the control terminal 102, which is the output of the flip-flop 100 controlled by the audio select pushbutton 23. In the event that an audio mode has been selected, a process block 202 will set the channel recall pushbuttons such that they will now on/off control various audio circuits. In addition, a subsequent process block 203 will result in illuminating the graphics which identify the audio control circuits which are now controllable by the pushbuttons 14 in the audio mode. Also, a process block 204 will result in providing the main display 17 with distinctive displays indicating the operative state of the audio control circuits now directly being controlled by the pushbuttons 14. After the process block 204, a decision block 205 determines if more than 10 seconds have elapsed from either the implementation of the audio mode of the last actuation of one of the pushbuttons 14 which has adjusted an audio control circuit now controlled by these pushbuttons. If such a time period has passed, then a process block 206 will result in terminating the audio mode and control will return to the initializing terminal 200. If the 10 second period has not expired, then control also returns to the initial terminal 200, but without the termination of the audio mode. Obviously, the terminating of the audio mode in the discrete implementation in FIG. 4 is caused by the monostable 137 resetting the flip-flop 100 to a desired state which corresponds to the tuning mode wherein the tuning mode refers to the nonexistence of the audio mode during which the pushbuttons 14 control audio control circuits rather than the radio tuning circuitry 103.

In the event the audio mode decision block 201 does not determine that an audio mode has been selected, a process block 207 makes sure that the channel recall pushbuttons 14 are able to perform their channel tuning operation. This is accomplished by having the control signal at the terminal 102 enable the tuning circuitry 103 to be responsive to actuation of the pushbuttons 14.

After the process block 207, a decision block 208 determines if a volume mode of operation for the radio receiver is desired, wherein this determination corresponds to the discrete implementation in FIG. 3 to determining what state the multiplexers 59 and 63 are in since their first operative state corresponds to a volume mode. If a volume mode has been selected by either sequential actuation of the pushbutton 22 or the automatic timing action of the monostable 60, then a process block 209 insures that actuation of the up/down pushbuttons 20 and 21 will now result in incrementing the volume counter to control the volume of the radio receiver, and a process block 210 insures that the display 17 provides an indication of the entertainment channel to which the receiver is tuned. After the process block 210, control returns to the initializing terminal 200.

If the decision block 208 determines that a volume mode has not been selected for the receiver, then control passes to a decision block 211 which determines whether a balance mode has been selected, wherein the balance mode would correspond to the third possible state of the multiplexers 59 and 63 wherein the oscillator pulses are coupled through the gate 57 to the balance counter and the count of this counter is coupled through the multiplexer 63 to the main display 17. If the decision block 211 determines that a balance mode has been selected by the operator of the receiver 10, circuitry is set such that actuation of the up/down pushbuttons 20 and 21 will now control the count of the balance counter rather than control the count of the volume counter, and the display 17 will now indicate the balance adjustment. These two steps are accomplished by the process blocks 212 and 213. After the process block 213, control is passed to a summing terminal 214.

In the event a balance mode has not been selected, the decision block 211 will now pass control to two process blocks 215 and 216 which will essentially implement a fader mode of operation for the radio receiver 10 since neither a volume nor a balance mode has been selected for the receiver, leaving only the existence of a fader mode as the possible mode of operation for the receiver 10. The process block 215 insures that actuation of the up/down pushbuttons 20 and 21 will now control the count in the fader counter 69, and the process block 216 insures that the main display 17 will provide a display indicative of the amount of fader adjustment provided by the control count maintained at the terminal 71.

After the process block 216, again control is passed to the summing terminal 214 which is provided as an input to a decision block 217 which determines whether 10 seconds has elapsed from the last actuation of either the up/down pushbuttons 20 or 21 or the selection of the balance and fader modes. This corresponds in discrete circuit terms to the operation of the monostable 60 determining the 10 second period for the existence of the fader and balance modes. If such a period of time has not elapsed, then control passes back to the initializing terminal 200. However, once the decision block 217 has determined that the 10 second period has elapsed, then control is passed to a process block 218 which results in setting the radio receiver 10 to the volume mode, thereby terminating the balance and fader modes of operation. In discrete circuit terms, this is analogous to having the output of the monostable 60 resetting the multiplexers 59 and 63 to their initial state which corresponds to the volume mode of operation. After the process block 218, control is again transferred to the initializing terminal 200.

The explanation of the flow chart in FIG. 6 has generally been in accordance with the operation of the discrete circuit implementations shown in FIGS. 3 and 4. However, other implementations are possible without departing from the spirit of the present invention. While we have shown and described specific embodiments of this invention, further modifications and improvements may occur to those skilled in the art. All such modifications which retain the basic underlying principles disclosed and claimed herein are within the scope of this invention.

What is claimed is:

1. An entertainment device comprising:
    at least first and second speakers providing audio signals related to signals on an entertainment channel to which said entertainment device is tuned;
    volume control means including up/down manual switch means, said volume control means, in a volume mode of operation of said entertainment device, operative in response to actuation of said up/down switch means for simultaneously step adjusting in the same direction the overall magnitude of all of the audio signals provided by each of said first and second speakers;
    balance control means being operative in a balance mode of operation of said entertainment device for simultaneously step adjusting in opposite directions, in response to actuation of said up/down switch means, the overall magnitude of all of the audio signals provided said first speaker with respect to the overall magnitude of the audio signals provided said second speaker; and
    manual selection means for selecting any one of said volume and balance modes for said entertainment device, whereby the same up/down switch means controls the related functions of volume and balance.

2. An entertainment device according to claim 1, wherein each of said volume and balance means includes a counter whose count controls the magnitude of the audio signals provided by said first and second speakers, and wherein actuation of said up/down switch means selectively increments the count of said counter.

3. An entertainment device according to claim 1, which includes timing means for automatically resuming said volume mode a predetermined time after the selection of said balance mode.

4. An entertainment device according to claim 3, wherein said timing means includes circuitry for automatically resuming said volume mode a fixed time after the last actuation of said up/down switch means in said balance mode.

5. An entertainment device according to claim 1 or 2, which includes third and fourth speakers providing audio signals related to the signals on said tuned entertainment channel to which said entertainment device is tuned, said volume control means simultaneously step adjusting in the same direction the overall magnitude of the audio signals provided by each of said first, second, third and fourth speakers, and said balance means adjusting the magnitude of all of audio signals of said first and third speakers in an opposite direction with respect to the magnitude of all of audio signals of said second and fourth speakers.

6. An entertainment device according to claim 5, which includes fader control means being operative in a fader mode of operation of said entertainment device for simultaneously step adjusting in opposite directions, in response to actuation of said up/down switch means, the overall magnitude of all of the audio signals provided by said first and second speakers with respect to the overall magnitude of all of the audio signals provided by said third and fourth speakers, and wherein said selection means includes circuitry for selecting any one of said volume, balance and fader modes for said entertainment device.

7. An entertainment device according to claim 6, wherein said fader means includes a counter whose count controls the magnitude of the audio signals provided by said speakers and wherein during said fader mode, actuation of said up/down switch means selectively increments the fader count.

8. An entertainment device according to claim 6, wherein said selection means comprises a manual mode selection pushbutton, and actuation of said selection pushbutton sequentially selects said volume, fader and balance mode for said entertainment device.

9. An entertainment device according to claim 1 or 2, wherein said selection means comprises a manual mode selection pushbutton, actuation of which sequentially selects said volume and balance means.

10. An entertainment device according to claim 2, which includes a display for providing a visual indication indicative of the magnitude of the balance control count.

11. An entertainment device according to claim 7, which includes a display for providing visual indications indicative of the magnitude of the balance and fader control counts.

12. An entertainment device according to claim 1 or 2, wherein said up/down switch means comprises a manual up pushbutton and a manual down pushbutton.

13. An entertainment device according to claim 2, which includes a power supply means for supplying DC power to audio amplifiers in said device in response to the count in said volume counter being equal to and above a predetermined value, and for terminating said DC power in response to the count in said volume counter being below said predetermined value.

14. An entertainment device comprising:
at least first and second speakers providing audio signals related to signals on an entertainment channel to which said entertainment device is tuned;
manual control means, including balance means for manually adjusting, in a balance mode, the relative overall magnitude of the audio signals provided by said first speaker with respect to the audio signals provided by said second speaker;
display means for normally providing, in a volume mode, a visual display indicative of the channel to which the entertainment device is tuned; and
manual select means for selectively implementing a balance mode for said entertainment device while terminating the volume mode and causing, in the balance mode, said display means to provide a visual indication of the relative overall magnitude of the first speaker audio signals with respect to the overall magnitude of the second speaker audio signals, instead of said display means providing said tuned channel indication.

15. An entertainment device according to claim 14, wherein each display means comprises a plurality of visual display units, each capable of displaying a numeral in arabic form, each display unit comprising a plurality of orthogonal display segments.

16. An entertainment device according to claim 14, wherein said select means, during said balance mode, provides, by selective excitation of said display means, at least one bar graphic display whose position is indicative of the relative magnitude between the audio signals of said first and second speakers.

17. An entertainment device according to claim 16, wherein said bar graphic display comprises a bar display longitudinally oriented in a first direction and movable in a second direction, perpendicular to said first direction, to a position indicative of the relative magnitude of the audio signals provided by said first speaker with respect to the audio signals provided by said second speaker.

18. An entertainment device according to claim 14, which includes third and fourth speakers providing audio signals related to said tuned entertainment channel signals, and wherein said manual control means includes fader means for manually adjusting the relative overall magnitude of the audio signals provided by said first and second speakers with respect to the overall magnitude of the audio signals provided by said third and fourth speakers, wherein said balance means also adjusts the relative overall magnitude of the audio signals provided by said third speaker with respect to the audio signals provided by said fourth speaker.

19. An entertainment device according to claim 18, wherein said manual select means includes circuitry for selecting a fader mode for said entertainment device and causing therein said display means to provide a visual indication of the overall magnitude of the first and second speaker audio signals with respect to said magnitude of the third and fourth speaker audio signals, instead of said display means providing said tuned channel indication.

20. An entertainment device according to claim 19, wherein said select means includes apparatus for providing during said balance mode, by selective excitation of said display means, at least one bar graph display oriented longitudinally in a first direction and movable in a second direction perpendicular to said first direction to a position indicative of the relative overall magnitude of the audio signals provided by said first and third speakers with respect to the audio signals provided by said second and fourth speakers, and said select means including apparatus for providing, during said fader mode, by selective excitation of said display means, at least one bar graph display oriented longitudinally in said second direction and movable in said first direction to a position indicative of the relative overall magnitude of the audio signals provided by said first and second speakers with respect to the audio signals provided by said third and fourth speakers.

21. An entertainment device according to claim 14, wherein said select means includes a manual select pushbutton which, upon actuation, sequentially selects said volume and balance mode.

22. An entertainment device according to claim 18, wherein said select means includes a manual select pushbutton which, upon actuation, sequentially selects said volume, balance and fader modes.

23. An entertainment device according to claim 14 or 18, which includes timing means for automatically resuming said volume mode a predetermined time after the selection of a mode other than said volume mode.

24. An entertainment device comprising:
channel tuning means including a plurality of channel recall pushbuttons, actuation of each of said pushbuttons, during a tuning mode of said entertainment device, directly recalling a predetermined channel and tuning said entertainment device thereto;
display means for displaying, during said tuning mode, the channel to which said entertainment device is tuned;
manual audio control select means for terminating said tuning mode and implementing an audio control mode during which each of said recall pushbuttons, rather than controlling the tuning of said device, now act as on-off pushbuttons for controlling audio control circuits associated with each pushbutton for implementing various audio control functions; and wherein during said audio control mode said display means, rather than displaying the channel to which the entertainment device is tuned, now provides visual displays indicative of the on and off states of the audio control circuits associated with the pushbuttons.

25. An entertainment device according to claim 24, wherein said audio control select means provides a visual indication of the existence of the audio control mode.

26. An entertainment device according to claim 25, wherein said visual indication of the existence of the audio control mode includes providing illumination to graphic labels positioned adjacent to said pushbuttons, said labels identifying the associated audio circuits controlled by said pushbuttons during said audio mode.

27. An entertainment device according to claim 24, which includes timing means for automatically resuming said tuning mode a predetermined time after selecting said audio control mode.

28. An entertainment device according to claim 24, wherein said display means comprises a plurality of segmented display units, each of which provides an arabic numeral indication in said tuning mode, and each of said display units provides a distinctive other than arabic numeral indication in said audio control mode to indicate the on and off states of the associated audio control circuits.

* * * * *